United States Patent [19]

Fritsch

[11] Patent Number: 5,053,103
[45] Date of Patent: Oct. 1, 1991

[54] STRIP MAGAZINE FOR SURFACE MOUNTED DEVICE MANIPULATORS

[76] Inventor: Adalbert Fritsch, Utzenhofen 46, D-8455 Kastl, Fed. Rep. of Germany

[21] Appl. No.: 361,030

[22] Filed: Jun. 2, 1989

[30] Foreign Application Priority Data

Jun. 3, 1988 [DE] Fed. Rep. of Germany ... 8807239[U]

[51] Int. Cl.⁵ ..................... B32B 31/18; B65B 69/00; B65H 5/28
[52] U.S. Cl. ..................................... 156/584; 156/344
[58] Field of Search .............................. 226/5; 228/6.2; 156/344, 584

[56] References Cited

U.S. PATENT DOCUMENTS

| | | | |
|---|---|---|---|
| 4,738,386 | 4/1988 | Itemadani et al. | 156/584 X |
| 4,820,369 | 4/1989 | Kubo | 156/584 X |
| 4,869,393 | 9/1989 | Soth | 156/344 X |
| 4,915,770 | 4/1990 | Haeda et al. | 156/344 |
| 4,943,342 | 7/1990 | Golemon | 156/344 X |

Primary Examiner—Caleb Weston
Assistant Examiner—Mark A. Osele
Attorney, Agent, or Firm—Spencer & Frank

[57] ABSTRACT

Strip magazine (1, 1') for surface mounted device (SMD) manipulators has a manually operated advance and includes the following features: the magazine includes an elongate, narrow plate body (2) whose width in the narrow direction corresponds to the width of the magazine strip (3). The upper narrow side (upper face 25) of the plate body (2) is bordered by two guide bars (4, 5) whose upper edges are angled toward one another and leave between them a gap (6) which is open at the top for removal of the components. Together with the upper face (25) of the plate body (2) disposed therebelow, these bars form a guide path (F) for the magazine strip (3). On the entrance side of the removal gap (6), there are devices for lifting off the covering tape (9) and for advancing the magazine strip (3). On the exit side of the removal gap (6), the guide path (F) changes to a reversal path (26) which opens into a return path (27) for the empty strip (3). The guide bars (4, 5) are combined into a component (10) that can be folded up and whose end lying at the exit side of the removal gap (6) is hinged to the plate body (2) in such a manner that, with the plate body in the folded-up insertion position, the upper face (25) of the plate body (2) is freely accessible.

18 Claims, 3 Drawing Sheets

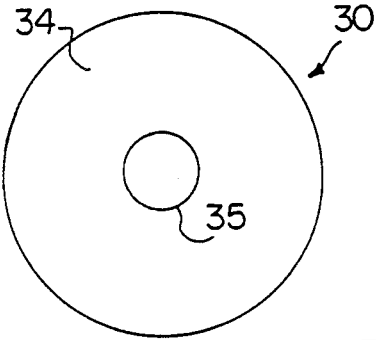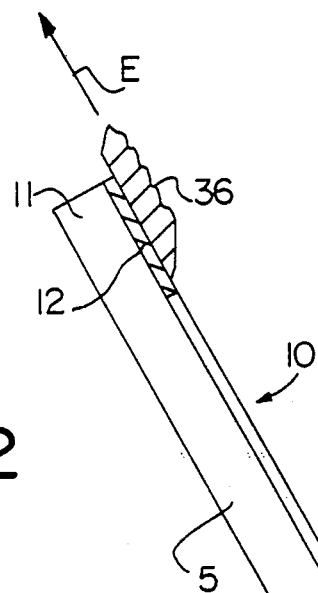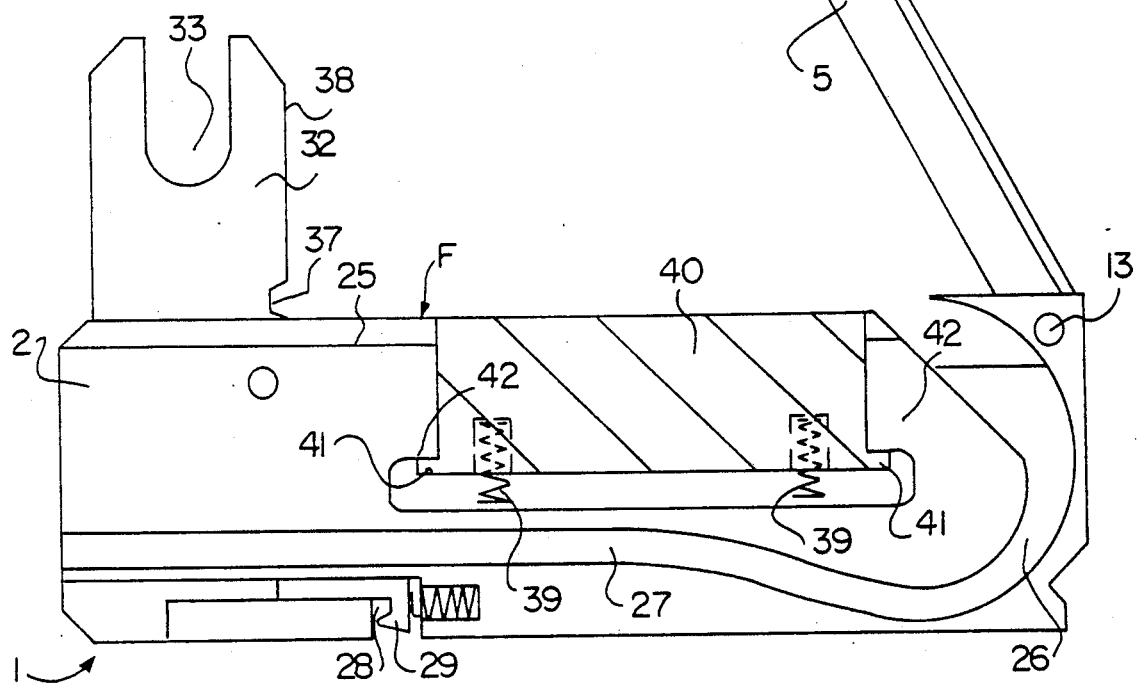
FIG. 2

STRIP MAGAZINE FOR SURFACE MOUNTED DEVICE MANIPULATORS

BACKGROUND OF THE INVENTION

The invention relates to a strip magazine for SMD manipulators (SMD = Surface Mounted Device) including a manually operated strip advance and comprising the following known features. The magazine is composed of an elongate narrow plate body whose width in the narrow direction corresponds to the width of the magazine strip. The upper narrow side of the plate body is bordered by two guide bars whose upper edges are angled toward one another, leaving a upwardly open gap between them for the removal of components; and, together with the upper face of the plate body disposed therebelow, they form a guide path for the magazine strip. There are elements for lifting off the covering tape and for advancing the magazine strip disposed at the entrance side of the removal gap. At the exit side of the removal gap, the guide path changes to a reversal path which opens into a return path for the empty strip, with this return path being disposed in the lower region of the plate body.

Such strip magazines are known. They are used, in particular, with SMD manipulators which are intended for equipping small series of electronic circuits. They may serve as a supplement to known turntables equipped with a plurality of compartments for components supplied in bulk and removed from the compartments as required. Or, if they are provided in sufficient numbers, they may serve as the sole suppliers of the components in place of these turntables.

The prior art strip magazines have been satisfactory in principle. However, it is desirable to reduce their structural width and to simplify their operation, particularly in connection with the insertion of a new strip.

SUMMARY OF THE INVENTION

It is an object of the invention to improve the prior art strip magazines for SMD manipulators in such a way that this is accomplished and, without consideration of the respective position of the strip magazine, each individual magazine in a row of identical, juxtaposed magazines, can be easily operated individually in normal use (advance; removal of components) and also in connection with threading in the associated strip.

To solve this problem, according to a first preferred embodiment of the invention the guide bars are combined into a component that can be folded upwardly and that is hinged to the plate body at its end disposed on the exit side of the removal gap in such a manner that, with this component in the folded-up insertion position, the upper face of the plate body is freely accessible. With this measure, it is accomplished that the entire guide path for the strip can be exposed by means of a simple operational manipulation so that the strip can easily be inserted into the magazine from the top. Thus, a plurality of such narrow strip magazines can be set up in a row without the insertability of the strip into each individual magazine being interfered with. Additionally, the cumbersome threading of the strip into its guide path is no longer required.

In the first embodiment, the fold-up component may be composed of the two guide bars whose upper edges are angled toward one another, with these guide bars being connected with one another at their front ends by means of a bridge. The bridge imparts the necessary stability to the two bars and additionally provides a opportunity to itself form a handle for operation of the bar component. This improves user-friendliness even more.

According to another feature of the invention the guide bars, fitted into a component, are pivotal about an axis disposed in that region of the plate body which is disposed on the side of the reversal path facing away from the guide path. In this way, the guide path can be opened all the way to the back in order to supply the magazine with a new strip and to thread the strip into the return for the empty strip, so that the entire device is freely accessible.

A further advantageous feature of the first preferred embodiment of the invention comprises the device for lifting off the covering tape and for advancing the magazine strip being a reel which is disposed above the guide path and in front of the bridge connecting the two guide bars so as to roll up the stripped off covering tape. This reel is mounted so as to rotate on two facing bearing cheeks on the sides of the plate body which leave between them a passage opening for the magazine strip. In this structure, two of the objects of the invention are realized, namely the easy insertability of the magazine strip, and the narrow structural configuration of the magazine can be retained without difficulty. In order to insert the magazine strip, it is merely necessary to remove the reel which corresponds to the width of the strip, open the bar component and insert the new strip. After the component has been closed, the beginning of the covering tape can be pulled off the strip and can be fixed to the reel which has been inserted into the bearing cheeks. Rotation of the reel simultaneously causes the covering tape to be pulled off the strip and the latter is transported further through the removal gap. It is here sufficient for the reel axis to be inserted into upwardly open insertion recesses in the bearing cheeks.

Other advantageous modifications of the first preferred embodiment of the invention include the strip component being fixed in the closed position in a structurally particularly simple manner. Additionally, release and re-engagement of the defined detent device are very user-friendly.

According to a further preferred embodiment of the invention, a pivotal advancing lever disposed ahead of the bar component, when seen in the direction of strip advance, is provided as the device for lifting off the covering tape and advancing the magazine strip and is insertable, by means of a downwardly oriented pin, into feed holes in the strip to be pushed back and forth in the advancing direction. In this embodiment as well as the first preferred embodiment, it is accomplished that the entire guide path can be exposed for the strip so that the strip can be easily inserted into the magazine. On the other hand, due to its novel configuration, the advancing lever can be kept narrow and nevertheless can easily be gripped individually to push it back and forth. In this way, the strip is reliably advanced and the covering tape with which such strips are equipped in order to cover the magazine recesses, can be removed easily and rolled up by means of any desired apparatus. The narrow configuration of the newly proposed strip magazines also makes it possible to place the supply rolls for the strips in a mutually offset arrangement so that in this manner even more space is gained in the width direction.

Another advantageous feature of the second preferred embodiment of the invention is that a centering spur for the advancing lever is disposed on the bridge of the bar component and takes care, if necessary, that the advancing lever reaches precisely the correct position in which its spur engages in the feed holes of the strip. Details of this are evident from the description of the drawings to follow. The arrangement may also be such that the centering spur is not disposed on the bridge but itself forms the bridge. The only important factors are sufficient stabilization of the component and reliable centering of the advancing lever.

It is further feature of the second preferred embodiment of the invention that the advancing lever be insertable into the feed holes of the strip in the region of the removal gap. In this region, the strip is exposed toward the top in any case so that this arrangement results in the simplest and most compact structure.

According to another feature of the second preferred embodiment of the invention, the advancing lever preferably may be composed of two thin-walled lateral struts which are bent at an angle at their front ends. This provides the advantage that the advancing lever will not noticeably broaden the device so that the entire device can be kept as slim as possible. By providing the angled end, on the other hand, sufficient stability is produced which is significant, in particular, for the constantly stressed advancing lever.

In a further variation of the second preferred embodiment of the invention, the two lateral struts of the advancing lever go around the plate body and are mounted as so as to be pivotal about an axis of rotation at the end of the bent portion. The axis of rotation itself passes through a gap extending in the longitudinal direction of the plate body and is displaceable in that gap. It has been found to be best for the length of the gap to correspond to the length of the removal gap.

Finally, another feature of the second preferred embodiment of the invention is that the advancing lever may be equipped with a handle at its one end. This handle may be a plastic component which is provided with an upwardly projecting handle lug. Moreover, the handle may be used as a supporting bearing for the mentioned pin that must be inserted into the feed holes in the strip in order to advance the latter.

By configuring the strip magazine a defined in claim 18, the magazine strip is pressed, in the region of the removal gap, against the guide bars by a pressure stamp. Thus the magazine strip always takes on a defined height position in the guide path which is of importance particularly in connection with automatic assembly machines in order for them to operate without malfunction.

BRIEF DESCRIPTION OF THE DRAWINGS

FIG. 2, is a vertical sectional view taken along the center plane of the strip magazine of FIG. 1 in an open state;

DESCRIPTION OF THE PREFERRED EMBODIMENTS

Figure 1:
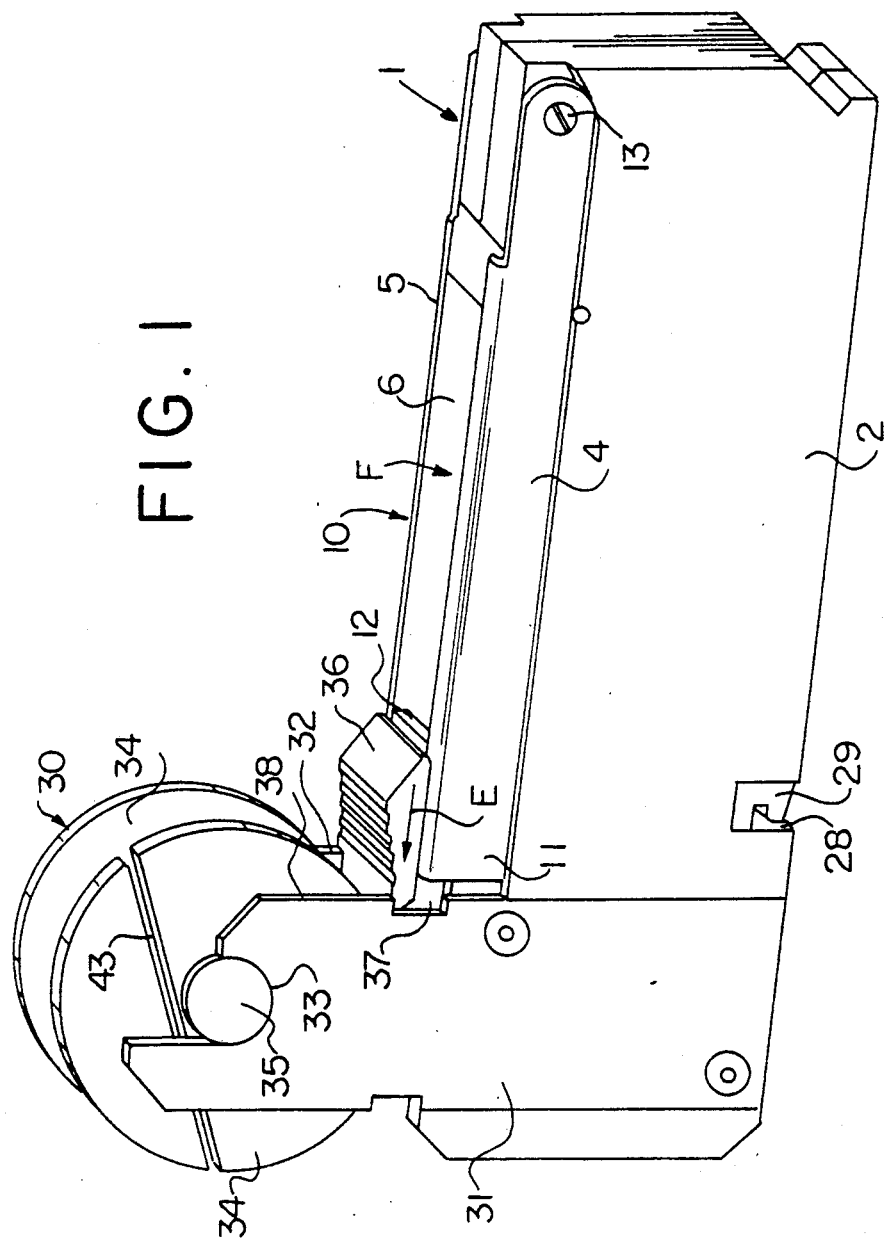
FIG. 1, is a perspective view of the strip magazine of a first preferred embodiment of the invention in a closed state, without a magazine strip in place.

The strip magazine shown in FIGS. 1 and 2 is generally designated by reference numeral 1. like components are given the same reference numerals in all Figures. The magazine 1 includes an elongate, narrow plate or body body 2 whose width essentially corresponds to the width of the magazine strip 3.

The narrow upper face of the plate body is bordered by two guide bars 4 and 5 whose upper edges are angled toward one another and which leave free between them a gap 6 which is open at the top for removal of the components. These components are disposed in a known manner in recesses 7 of strip 3.

Figure 3:
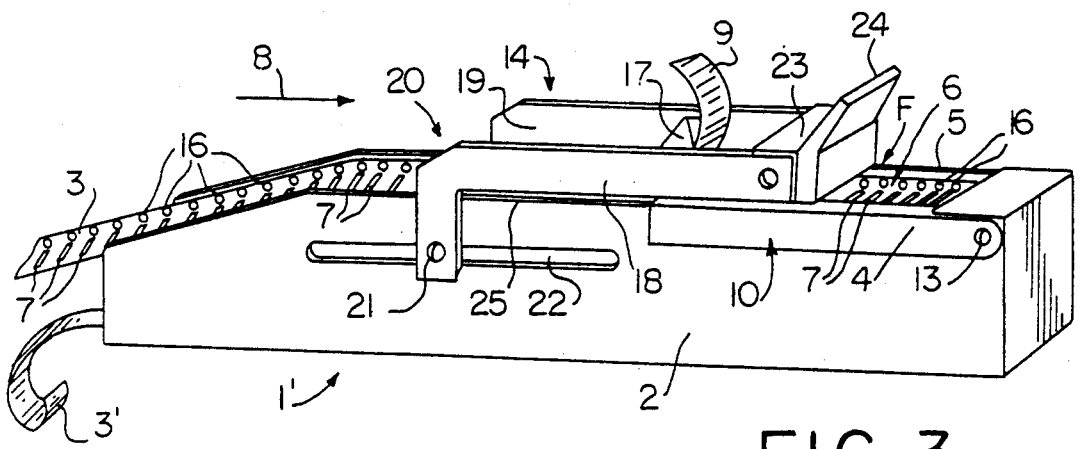
FIG. 3, a simplified perspective view of a second preferred embodiment of the strip magazine of the invention in a closed state, ready for operation.
Figure 4:
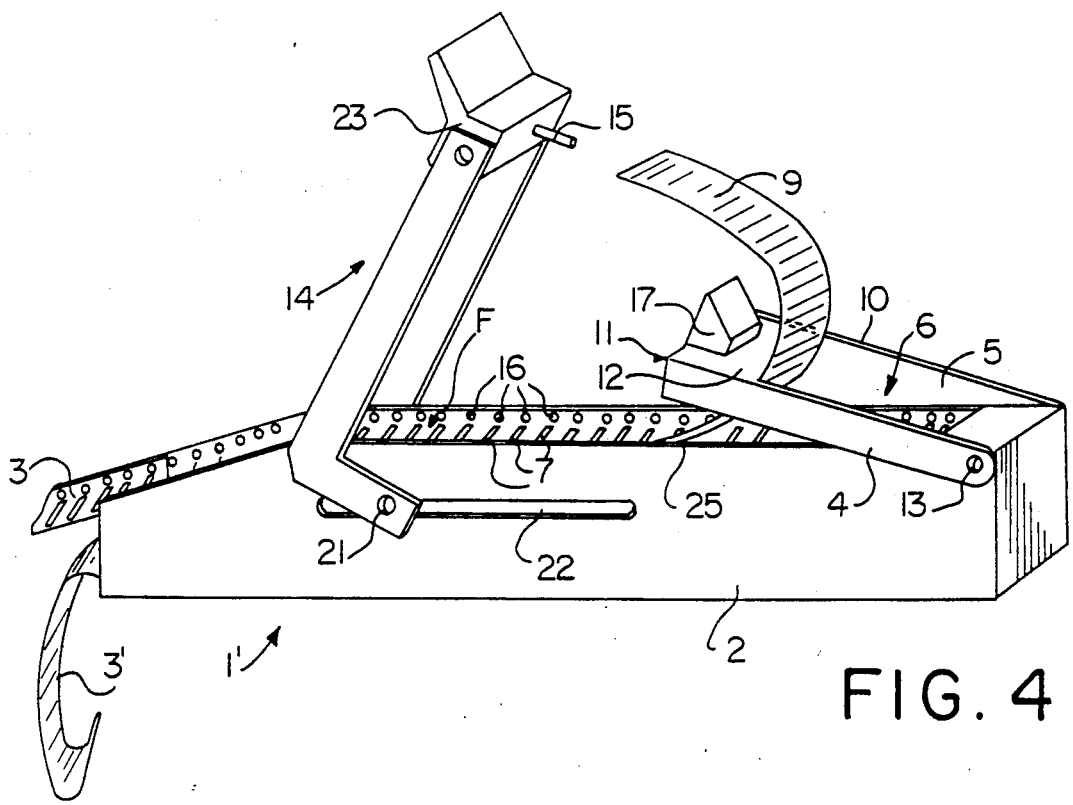
FIG. 4, is a perspective view of the strip magazine of FIG. 3 in an open state.

Turning to FIGS. 3 and 4, a second preferred embodiment of the invention is shown, in the operational state in which, strip 3 is introduced at the top of the magazine. The strip is securely guided on a guide path F, formed by guide bars 4, 5 and the upper face 25 of plate body 2, and is advanced in the direction of arrow 8. A covering tape 9 normally closing the recesses is pulled off when strip 3 advances and is removed from magazine 1 toward the top. A sufficient number of filled recesses is exposed in removal gap 6 to permit the removal of the components there. In the interior of plate body 2, the strip is advanced by means of a reversal device shown in FIG. 2 and, finally, the empty strip exits from the magazine at 3'. The reversal device is formed of a reversal path 26 which follows guide path F and describes an approximately semicircular arc in the interior of plate body 2. It is continued as a return path 27 which passes through plate body 2 parallel to guide path F and leaves the plate body on the side opposite the narrow side of plate body 2 as indicated at position 3'. Below return path 27, a cut 28 is provided in plate body 2 by means of which, with the cooperation of a spring-tensioned snap-in tab 29, the strip magazine 1 can be firmly snapped onto a holder.

According to the invention, the guide bars 4, 5 otherwise fixed to the plate body, are combined into a pivotable element or component 10 which can be folded up. This component is thus composed of the two abovementioned guide bars whose front ends 11 are connected with one another by way of a bridge 12. At the opposite end (exit side of removal gap 6) the component has an axis 13 which is disposed on the side of reversal path 26 facing away from guide path F, with component 10 being upwardly pivotal about this axis.

In the first preferred embodiment of the invention shown in FIGS. 1 and 2, the device for lifting off covering tape 9 and advancing magazine strip 3 above guide path F and in front of a bridge 12 connecting the two guide bars 4, 5 is a reel 30 on which the pulled-off covering tape 9 is wound. This reel is rotatably supported on two bearing cheeks 31, 32 which face one another on the sides of plate body 2 and between them leave a passage opening for magazine strip 3. For this purpose, bearing cheeks 31, 32 are each provided with upwardly open, semicircular insertion recesses 33 for a reel axis 35 which is shaped in the form of a shaft stump to a pair of discs 34 of the reel. Bridge 12 includes a manually actuated sliding detent member 36 whose detent end, with component 10 in the closed position, engages in corresponding detent recesses 37 in the edges 38 of bearing cheeks 31, 32 on the side of the removal gap. The sliding detent member is spring tensioned (not shown) in its direction of engagement E.

As can be seen in FIG. 2, a pressure stamp 40 is mounted in plate body 2 so as to be displaceable. Pressure stamp 40 is charged by two compression springs 39, and its displacement path is limited to the height of guide path F by lateral projections 41 on pressure stamp 40 and corresponding stops 42 in plate body 2. In the region of removal gap 6, starting at the upper face of plate body 2, pressure stamp 40 urges magazine strip 3 against guide bars 4, 5.

In order to supply strip magazine 1 with a magazine strip 3, reel 30 is removed from bearing cheeks 31, 32, sliding detent member 36 is opened, and component 10 is folded upwardly (FIG. 2). Thus the entire guide path F is exposed and magazine strip 3 can be inserted from the top. After component 10 has been closed by engagement of sliding detent member 36 into detent recesses 37 in bearing cheeks 31, 32, covering tape 9 is pulled off and fixed in holding slot 43 in one of the two reel discs 34. After insertion of reel 30 into insertion recesses 33 of bearing cheeks 31, 32, rotation of reel 30 further transports magazine strip 3 by way of the pull exerted on covering tape 9. Magazine strip 3 is thus automatically threaded into reversal path 26.

In the alternative embodiment shown in FIGS. 3 and 4, a pivotal advancing lever 14 is provided which is equipped with a downwardly oriented pin 15 for insertion into feed holes 16 in strip 3 and which can be moved back and forth in the advancing direction (arrow 8).

When the components provided in recesses 7 in the region of removal gap 6 have been used up, advancing lever 14, which is then in the position shown in FIG. 3, can easily be pushed forward, carrying strip 3 along for a corresponding length. The lever is then raised slightly, pushed back towards the rear and set down again. Filled recesses in the strip are then again available in the region of the removal opening.

With the described operation of the device, it is important for pin 15 to always engage precisely into the feed holes 16 of strip 3 when advancing lever 14 is lowered. To ensure this, a centering spur 17 is disposed on bridge 12 so as to enter, upon lowering of advancing lever 14, into the space between the two guide bars 4 and 5 and automatically bring the lever into the correct position.

It is of particular advantage for the mentioned components to be arranged in such relation to one another that the advancing lever 14 can be introduced into the feed holes 16 of strip 3 in the region of removal gap 6. This case is also shown in the drawing.

Advancing lever 14 is preferably composed of two thinwalled lateral struts 18 and 19 which are bent at an angle at their front ends 20, thus forming a vertically extending bent portion as viewed in FIG. 3. In this way, they are also given sufficient stability without advancing lever 14 having to be noticeably wider than plate body 2. The two lateral struts 18, 19 here extend around plate body 2 and are mounted so as to be pivotal about an axis of rotation 21 at the end of the bent portion. This axis of rotation 21 passes through a slot or gap 22 extending in the longitudinal direction of plate body 2 and is displaceable within this gap. Preferably, the length of gap 22 corresponds to the length of removal gap 6.

In the illustrated preferred embodiment, advancing lever 14 is provided with a gripping member 23 at its one end. This gripping member is equipped with a handle 24 by means of which advancing lever 14 can be moved with ease. In a preferred embodiment, gripping member 23 additionally serves as holder for the already mentioned pin 15 which is introduced into feed holes 16 to transport strip 3.

The interior of strip magazine 1' essentially corresponds to that of strip magazine 1 and this applies, in particular, for reversal path 26 and return path 27.

I claim:

1. In a strip magazine for manually advancing a strip having components to be removed and a covering tape covering the components, said strip magazine including:

an elongated magazine body having an upper face;

two guide bars disposed adjacent said upper face of said magazine body; said two guide bars defining an upwardly open removal gap for the removal of the components from the strip; said removal gap having an entrance side and an exit side; said two guide bars and said upper face jointly defining a guide path having an entrance side and an exit side for the strip;

means disposed on said magazine body at the entrance side of the removal gap for lifting off the covering tape and for advancing the strip;

means for defining a reversal path and a return path in said magazine body and connected with the exit side of said guide path; said reversal and return paths guiding an empty strip after the components and covering tape have been removed;

the improvement comprising: and element including said two guide bars; and securing means for movably attaching said element to said magazine body for allowing said element to move between a closed position in which said two guide bars are adjacent said upper face and an insertion position in which said guide bars are spaced from said upper face for rendering said upper face freely accessible.

2. A strip magazine according to claim 1, wherein said element comprises a bridge disposed at an end of said element remote from said securing means; said bridge connecting together said two guide bars.

3. A strip magazine according to claim 1, wherein said element is rotatably attached to said magazine body so as to be pivotal about an axis disposed on a side of said reversal path spaced from said guide path.

4. A strip magazine according to claim 2, wherein said means for lifting off the covering tape and for advancing the strip comprises a reel for winding up the lifted-off covering tape; said reel is disposed above the guide path adjacent said bridge and is rotatably mounted on two bearing cheeks attached to said magazine body; said bearing cheeks face one another so as to define a passage opening for the strip.

5. A strip magazine according to claim 4, wherein said reel includes a reel shaft; each said bearing cheek has an upwardly open insertion recess rotatably supporting said reel shaft.

6. A strip magazine according to claim 4, wherein each said bearing cheek includes means for defining a detent recess facing said removal gap; and further wherein said bridge includes a manually operable sliding detent member which engages into said detent recess when said element is in its closed position.

7. A strip magazine according to claim 6, further comprising spring means for resiliently biasing said sliding detent member towards said detent recess.

8. A strip magazine according to claim 1, wherein said means for lifting off the covering tape and for advancing the strip comprises an advancing lever pivotably attached to said strip magazine upstream of said element as viewed in a direction of advancement of the strip; said advancing lever has a pin for insertion into feed holes in a strip and is movable back and forth parallel to the direction of advancement.

9. A strip magazine according to claim 8, further comprising a centering spur mounted on said element for centering said advancing lever.

10. A strip magazine according to claim 8, wherein said element comprises a bridge disposed at an end of said element remote from said securing means; said bridge connecting together said two guide bars and including a centering spur for centering said advancing lever.

11. A strip magazine according to claim 8, wherein said advancing lever is configured for introducing said pin into feed holes in the strip in the region of said removal gap.

12. A strip magazine according to claim 8, wherein said advancing lever has an upstream end as viewed in a direction of strip advance; said advancing lever comprises two thin-walled lateral struts having an angled bent portion at the upstream end.

13. A strip magazine according to claim 12, wherein said two lateral struts extend around said magazine body and are mounted so as to be pivotable about an axis of rotation at an end of said bent portion.

14. A strip magazine according to claim 13, further comprising a slot in said magazine body; said axis of rotation comprises a shaft extending through said slot and being displaceable within said slot.

15. A strip magazine according to claim 14, wherein said slot and said removal gap have substantially identical lengths.

16. A strip magazine according to claim 8, wherein said advancing lever comprises a gripping member for allowing gripping and manual displacement.

17. A strip magazine according to claim 16, wherein said pin is disposed on an underside of said gripping member.

18. A strip magazine according to claim 1, further comprising a resiliently biased pressure stamp displaceably disposed in said magazine body for urging the strip from said upper face of said magazine body against said two guide bars in the region of said removal gap.

* * * * *